United States Patent
Owen

(10) Patent No.: US 8,237,501 B2
(45) Date of Patent: Aug. 7, 2012

(54) POWER AMPLIFIER WITH TRANSISTOR INPUT MISMATCHING

(75) Inventor: Christopher Michael Owen, Pittsford, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 13/222,202

(22) Filed: Aug. 31, 2011

(65) Prior Publication Data

US 2012/0062322 A1     Mar. 15, 2012

Related U.S. Application Data

(60) Provisional application No. 61/381,284, filed on Sep. 9, 2010.

(51) Int. Cl.
*H03F 3/217*     (2006.01)

(52) U.S. Cl. .................... 330/251; 330/295; 330/124 R; 330/207 A

(58) Field of Classification Search .................. 330/295, 330/124 R, 251, 207 A, 255
See application file for complete search history.

(56) References Cited

U.S. PATENT DOCUMENTS

| | | | |
|---|---|---|---|
| 6,949,978 B2 * | 9/2005 | Tayrani et al. | 330/251 |
| 7,630,220 B2 * | 12/2009 | Kotani et al. | 363/25 |
| 2006/0261887 A1 | 11/2006 | Kim et al. | |
| 2007/0018729 A1 | 1/2007 | Itkin et al. | |
| 2009/0045877 A1 | 2/2009 | Wang et al. | |

OTHER PUBLICATIONS

International Search Report for International Patent Application No. PCT/US2011/050494, dated Apr. 18, 2012.

* cited by examiner

*Primary Examiner* — Hieu Nguyen
(74) *Attorney, Agent, or Firm* — Harness, Dickey & Pierce, P.L.C.

(57) ABSTRACT

A power amplifier includes an input module. The input module includes a transformer and is configured to receive a radio frequency signal and generate output signals. Impedance transformation modules each of which having an output impedance and configured to receive a respective one of the output signals from the transformer. Switch modules each of which comprising a transistor and connected to an output of one of the impedance transformation modules. The transistor has an input impedance and outputs an amplified signal. Each of the output impedances is mismatched relative to a respective one of the input impedances.

20 Claims, 2 Drawing Sheets

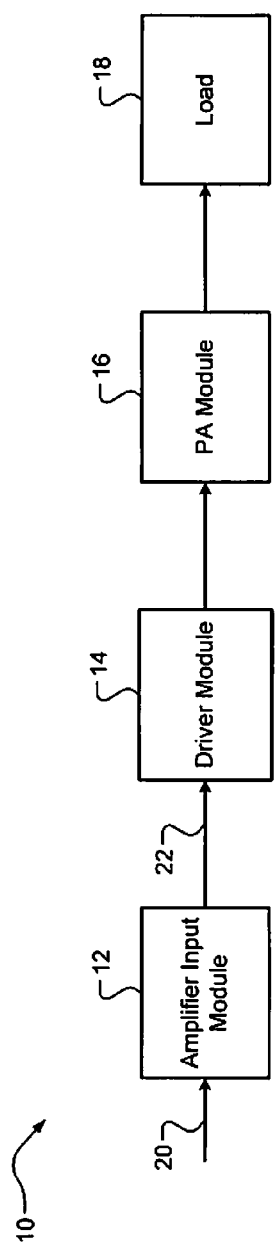
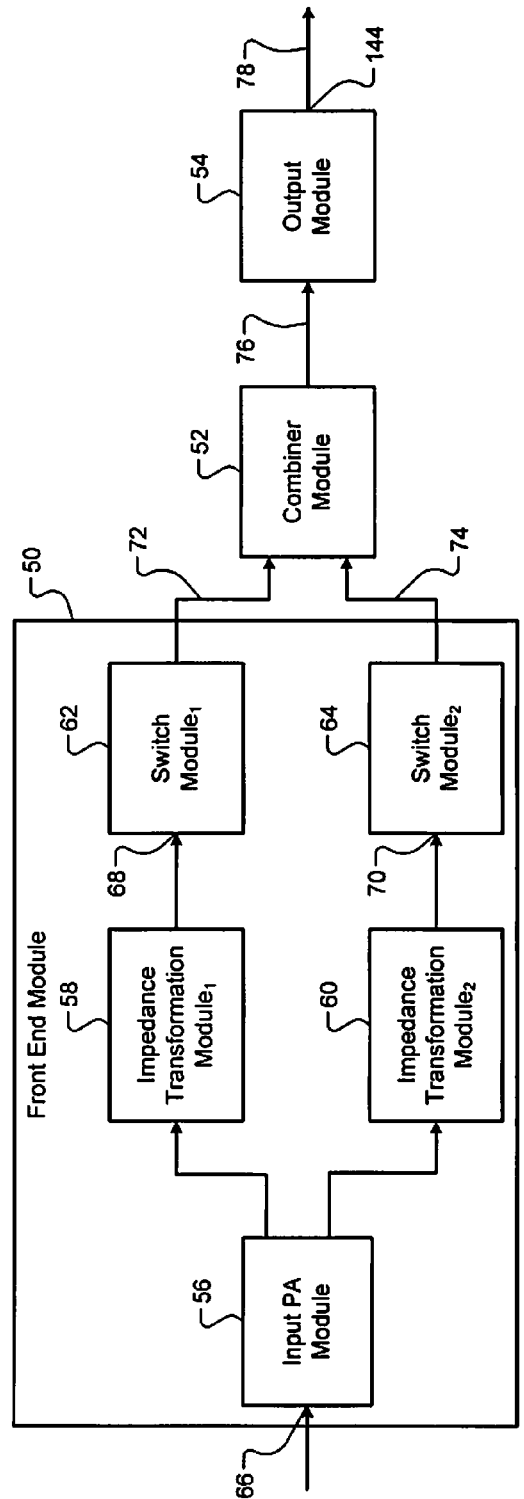

POWER AMPLIFIER WITH TRANSISTOR INPUT MISMATCHING

CROSS-REFERENCE TO RELATED APPLICATIONS

This application claims the benefit of U.S. Provisional Application No. 61/381,284, filed on Sep. 9, 2010. The disclosure of the above application is incorporated herein by reference in its entirety.

FIELD

The present disclosure relates to stability of radio frequency (RF) power amplifiers and to structures of a RF power amplifier.

BACKGROUND

This section provides background information related to the present disclosure. This section is not necessarily prior art.

Various industries use RF power amplifiers to amplify signals to drive voltage standing wave ratio (VSWR) loads. By way of a non-limiting example, a RF generator may include multiple RF power amplifiers. The RF power amplifiers may be used to drive a load, such as a plasma chamber. The combined power from the RF power amplifiers drives the plasma chamber to fabricate various components such as integrated circuits, solar panels, compact disks (CDs), digital versatile (or video) discs (DVDs), and the like.

Power amplifiers may have stability operating requirements. The stability requirements may include providing a fundamental frequency output signal without introducing spurious frequencies. A fundamental frequency may refer to a frequency of an input signal received by a power amplifier and/or an operating frequency of the power amplifier. The stability requirements may also include providing the fundamental frequency output signal in the presence of a load with an open circuit and/or a short circuit.

Various techniques are used to provide power amplifier stability. The techniques include series, shunt and feedback techniques. These techniques are ineffective in providing power amplifier stability for certain loads and input signal phases when operating at a fundamental frequency (e.g., 40 megahertz (MHz)). Various frequency signals other than the input signal are produced at the output of the power amplifier when the power amplifier becomes unstable. The frequencies of the various frequency signals include (i) a signal at approximately half the fundamental frequency and (ii) other signals at close in sideband frequencies (e.g., 1 kilohertz (KHz)-2 MHz) around the fundamental frequency.

SUMMARY

A power amplifier is provided and includes an input module. The input module includes a transformer and is configured to receive a radio frequency signal and generate output signals. Impedance transformation modules each of which having an output impedance and configured to receive a respective one of the output signals from the transformer. Switch modules each of which comprising a transistor and connected to an output of one of the impedance transformation modules. The transistor has an input impedance and outputs an amplified signal. Each of the output impedances is mismatched relative to a respective one of the input impedances.

In other features, a power amplifier is provided and includes an input module. The input module includes a transformer and is configured to receive a first radio frequency signal. The transformer includes a first end and a second end. The first end is configured to output a first output signal based on the first radio frequency signal. The second end is configured to output a second output signal based on the first radio frequency signal. A first capacitance is in series with the first end and has a first output impedance. A second capacitance is in series with the second end and has a second output impedance. A first transistor includes a control terminal connected to the first capacitance, has a first input impedance, and outputs a first amplified signal. The first input impedance does not match the first output impedance. A second transistor includes a control terminal connected to the second capacitance, has a second input impedance, and outputs a second amplified signal. The second input impedance does not match the second output impedance.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The drawings described herein are for illustrative purposes only of selected embodiments and not all possible implementations, and are not intended to limit the scope of the present disclosure.

FIG. 1 is a block diagram of a power generator system incorporating a power amplifier module in accordance with the present disclosure;

FIG. 2 is a block diagram of power amplifier module in accordance with the present disclosure.

Corresponding reference numerals indicate corresponding parts throughout the several views of the drawings.

DETAILED DESCRIPTION

Figure 3:
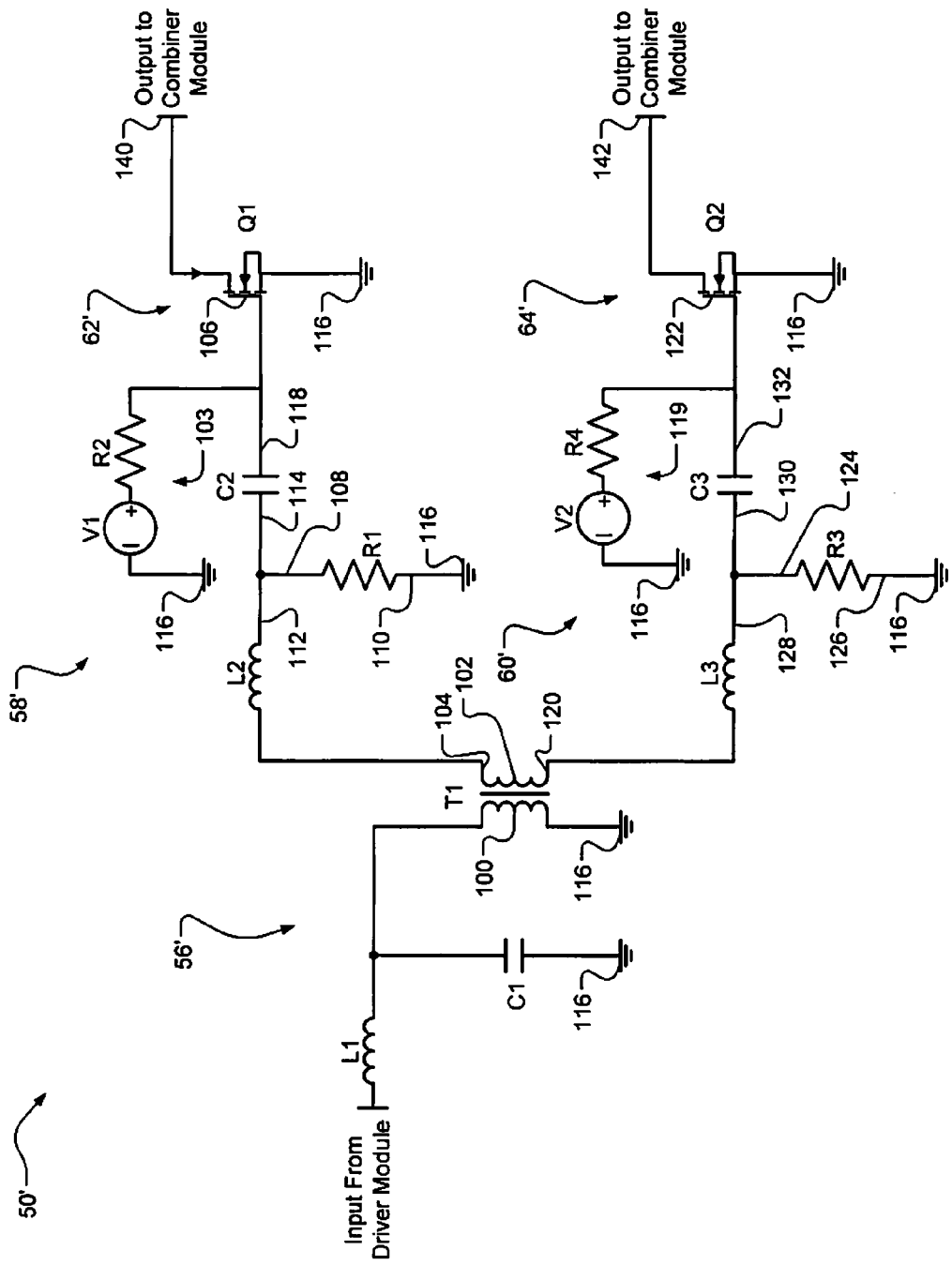
FIG. 3 is a schematic view of a front end module of a power amplifier module in accordance with the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

In FIG. 1, a power generator system 10 is shown. The power generator system 10 includes an amplifier input module 12, a driver module 14, a power amplifier (PA) module (or simply PA) 16, and a load 18. The amplifier input module 12 receives and conditions a radio frequency (RF) signal 20 to generate a conditioned signal 22. The amplifier input module 12 may include, for example, a pre-amplifier. The conditioned signal 22 is provided to the driver module 14. Output of the driver module 14 is received by the PA module 16, which may be a high-power RF PA module. By way of a non-limiting example, the PA module 16 may provide a power output of greater than or equal to 2.5 kilowatts (kW). Output of the PA module 16 drives the load 18.

The load 18 may include be any of a number of elements or devices driven by a RF signal, including, by way of a non-limiting example, a plasma chamber. The load 18 may include broadband mismatched loads (i.e. cables with mismatched resistor terminations), narrowband mismatched loads (i.e. a 2-element matching network) and resonator loads.

Referring now also to FIG. 2, an example of the PA module 16 (identified as 16') is shown. The power amplifier module 16' may include a front end module 50, a combiner module 52, and an output module 54. The front end module 50 may include an input PA module 56, impedance transformation modules 58, 60, and switch modules 62, 64. The input PA module 56 receives an oscillating input signal (e.g., the input signal 20), which may be at various frequencies and have various phases. The input PA module 56 provides the input signal to each of the impedance transformation modules 58, 60. The input PA module 56 provides impedance transformation between an input 66 of the input PA module 56 and the impedance transformation modules 58, 60. The input PA module 56 and the impedance transformation modules 58, 60 provide input impedance matching relative to output impedance (e.g., 50 Ohms (Ω)) of a driver module or device upstream from the PA module 16' (e.g., the driver module 14).

The impedance transformation modules 58, 60 provide the input signal to the switch modules 62, 64 and perform multiple tasks. The tasks include: impedance transformation between the input PA module 56 and the switch modules 62, 64; increasing input impedance at inputs 68, 70 of the switch modules 62, 64; contributing to providing input impedance matching of the PA module 16'; dissipating reflected power received from the switch modules 62, 64; etc. The switch modules 62, 64 receive respective output signals from the impedance transformation modules 58, 60 and generate amplified signals 72, 74. The combiner module 52 combines the amplified signals 72, 74 and generates a combined output signal 76, which is provided to the load 18 via the output module 54. Example combiner modules are disclosed in U.S. application Ser. No. 12/763,640, which is incorporated herein by reference in its entirety. The output module 54 receives the combined output signal 76 and provides filtering and conditioning to generate a PA output signal 78. The PA output signal 78 is applied to the load 18. Example output modules are disclosed in U.S. application Ser. No. 12/763,640, which is incorporated herein by reference in its entirety.

Referring now also to FIG. 3, an example schematic view of the front end module 50 (identified as 50') is shown. The front end module 50' includes an input PA module 56', impedance transformation modules 58', 60', and switch modules 62', 64'.

The input PA module 56' may include an inductance L1, a capacitance C1, and a transformer T1. The inductance L1 receives an input signal (e.g., the input signal 20). The inductance L1 and the capacitance C1 form an LC circuit that provides impedance transformation to match an output impedance (e.g., 50Ω) of a device upstream from the input PA module 56' (e.g., the driver module 14). The transformer T1 receives the input signal at a primary winding 100 and transforms the input signal across a core to a secondary winding 102 of the transformer T1. In various embodiments, the transformer T1 is a single-ended balanced transformer with a floating center tap. The ends of the secondary winding 102 of the transformer T1 are connected to respective ones of the impedance transformation modules 58', 60'.

The first impedance transformation module 58' includes an inductance L2, a resistance R1, a capacitance C2, and a first biasing circuit 103 including a resistance R2 and a voltage source V1. The inductance L2 and the capacitance C2 are in series between a first end 104 of the secondary winding 102 and a gate input 106 of a switch element Q1 (e.g., metal-oxide-semiconductor field-effect transistor (MOSFET)) of the first switch module 62'. The resistance R1 is a shunt resistance and includes a first end 108 and a second end 110. The first end 108 of the resistance R1 is connected to an output 112 of the inductance L2 and to an input 114 of the capacitance C2. The second end 110 of the resistance R1 is connected to ground 116. Output 118 of the capacitance C2 is connected to the gate input 106. The resistance R2 is connected between the gate input 106 and the voltage source V1. The voltage source V1 is connected between the resistance R2 and the ground 116. The resistance R2 and the voltage source V1 provide a first bias voltage to the gate input 106.

The second impedance transformation module 60' includes an inductance L3, a resistance R3, a capacitance C3, and a second biasing circuit 119 including a resistance R4 and a voltage source V2. The inductance L3 and the capacitance C3 are in series between a second end 120 of the secondary winding 102 and a gate input 122 of a switch element Q2 (e.g., MOSFET) of the second switch module 64'. The resistance R3 is a shunt resistance and includes a first end 124 and a second end 126. The first end 124 of the resistance R3 is connected to an output 128 of the inductance L3 and to an input 130 of the capacitance C3. The second end 126 of the resistance R3 is connected to the ground 116. Output 132 of the capacitance C3 is connected to the gate input 122. The resistance R4 is connected between the gate input 122 and the voltage source V2. The voltage source V2 is connected between the resistance R4 and the ground 116. The resistance R4 and the voltage source V2 provide a second bias voltage to the gate input 122. The second bias voltage may be equal to or different than the first bias voltage.

The inductances L1, L2, L3, capacitances C1, C2, C3, resistances R1, R2, R3, R4 and voltage sources V1 and V2 have respective input and output ends (or terminals), which may be connected as described herein and/or as shown in FIG. 3. The input and output ends have corresponding inputs, input impedances, outputs and output impedances.

The capacitances C2 and C3 increase input impedance and reactance of the gate inputs 106, 122 of the switch elements Q1 and Q2. By way of a non-limiting example, capacitance values of each of the capacitances C2 and C3 may be less than 1000 pico-Farad (pF). In one example implementation, each of the capacitance values is approximately 560 pF±10 pF and each of the capacitances C2, C3 has a reactance of approximately 7.5Ω. Capacitance values of the capacitances C2, C3 may be varied, for example, based on the frequency of operation. The capacitances C2 and C3 do not provide a conjugate impedance match relative to the input impedances of the switch elements Q1 and Q2, but rather provide an impedance mismatch.

The capacitances C2, C3 perform differently than direct current (DC) coupling capacitances. A DC coupling capacitance performs as a short circuit at high frequencies (i.e. has negligible impedance). A DC coupling capacitance may have, for example, a capacitance value of 5000 pF and reactance of 0.75Ω. A DC coupling capacitance does not provide the increased impedance and reactance of the capacitances C2, C3 and thus cannot provide power generator system stability as does the capacitances C2, C3.

Input impedance matching of the front end module 50' is difficult when the capacitances C2 and C3 are used alone (i.e. without use of the resistances R1 and R3) due to the high impedances and reactances of the capacitances C2 and C3. The resistances R1 and R3 are used to provide an input impedance that can be easily matched at the outputs 112, 128 of the inductors L2, L3 and/or at the input (e.g., input 66) of the front end module 50'.

In one example implementation, each of the resistances R1, R3 is less than approximately 50Ω. In another nominal example implementation, each of the resistances is approximately equal to 12Ω±1Ω when operating at a 40 MHz frequency. If higher impedance matching values are desired then higher resistance values may be used. As yet another nominal example implementation, each of the resistances R1, R3 is approximately 47Ω±1Ω when operating at a 60 MHz frequency. Resistance values of resistances R1 and R3 may be varied, for example, based on the frequency of operation. The resistance values of the resistances R1 and R3 may be based on trade offs between two or more of PA input return loss (S11), PA gain (S21) and PA stability. S21 is a scattering parameter and is a forward transmission coefficient of a 50Ω terminated output.

The resistances R1 and R3 reduce the impedance at the inputs 114, 130 of the capacitances C2 and C3. The resistances R1 and R3 also dissipate reflected power received from the switch modules 62', 64'. This prevents the reflected power from being received by a driver module (e.g., the driver module 14). The reflected power can negatively affect performance of the driver module and/or performance of other PAs operating in parallel with the PA module of the front end module (e.g., the PA module 16). At certain operating frequencies (e.g. greater than 60 MHz where transistor gain is low), the resistances R1 and R3 may not be included (i) when stability requirements are satisfied and (ii) to simplify the structure of the PA module.

The first switch module 62' includes the switch Q1. The second switch module 64' includes the switch Q2. The switches Q1 and Q2 include respect drains, gates and sources. The drains provide output signals of the switch elements Q1 and Q2. The gates are connected to the outputs 118, 132 of the capacitances C2 and C3. The sources are connected to the ground 116.

The resistances R2 and R4 may have resistance values greater than, for example, 100Ω. In one example implementation, the resistances R2 and R4 are greater than 1000Ω. In another example implementation, the resistances R1 and R4 are each approximately 10 kilo-Ohms (KOhms). Increased resistance values for the resistances R2 and R4 provides increased stability.

The capacitances C1, C2, C3, the transformer T1, the inductances L1, L2, L3, and the resistances R1, R3 are used to provide impedance transformation and to provide input impedance matching relative to a device upstream from the front end module 50' (e.g., the driver module 14).

The circuit elements between the input 66 of the front end module 50' and the switch elements Q1, Q2 may be collectively referred to as "the PA input network". The PA input network may include the inductances L1-L3, the capacitances C1-C3, the transformer T1, the resistances R1-R4 and the voltage sources V1-V2. The circuit elements between outputs 140, 142 of the front end module 50' (or switch elements Q1, Q2) and an output 144 the PA module 16 or 16' may be collectively referred to as "the PA output network". The PA output network may include elements of the combiner module 52 and the output module 54.

Each of the gate inputs 106, 122 of the switch elements Q1, Q2 is mismatched. The gate inputs 106, 122 are mismatched due to the use of the capacitances C2, C3. The capacitances are provided such that gain of the switch elements Q1, Q2 at a fundamental operating frequency does not exceed 15 dB. The capacitances C2, C3 reduce gain at frequencies other than the fundamental operating frequency. The capacitances C2, C3 provide low frequency gain roll off, which further reduces PA gain at less than or equal to half of the fundamental operating frequency, which improves stability. At half the fundamental operating frequency the switch elements Q1, Q2 may each have a maximum (or peak) gain due to the circuit elements and configuration of the circuit elements in the PA output network. The capacitances C2, C3 provide sufficient stability margin such that the power generator system 10 including the PA module 16 or 16' and the driver module 14 remain stable when driving various voltage standing wave ratio (VSWR) loads and operating at various phases.

In addition to providing low frequency gain roll off, the capacitances C2, C3 when operating at the fundamental operating frequency provide improved stability. The capacitances C2, C3 raise impedance seen by the gate inputs 106, 122 of the switch elements Q1, Q2, which reduces susceptibility of the switch elements Q1, Q2 from becoming instable during reception of high reflected RF power from high VSWR loads.

Providing mismatched gate inputs (or reduced transistor input impedance matching) is contrary to conventional approaches taken by RF designers. Providing mismatched gate inputs can reduce gain. The implementation of FIG. 3 does not include conjugate impedance matching, but rather provides mismatched gate input impedances. This increases impedance and reactance of the gate inputs.

Mismatched gate inputs as disclosed herein can be difficult to impedance transform to a predetermined impedance (e.g., 50Ω). For this reason, shunt resistors are incorporated (e.g., the resistances R1, R3), which allows input impedance (S11) of the PA module 16 or 16' to be tuned to the predetermined impedance. S11 is a scattering parameter associated with a 2-port (input/output) device and is an input reflection coefficient for a 50Ω terminated output. Thus, although the gate inputs 106, 122 are impedance mismatched, the input 66 of the PA module 16 or 16' is impedance matched to, for example, the output impedance of the driver module 14.

The resistances R1 and R3 allow reflected RF power from a mismatch load (e.g., the load of FIG. 1), which passes through the PA module 16 or 16' by reverse isolation S12 mechanisms, to be dissipated. S12 refers to a scattering parameter and is a reverse transmission coefficient of a 50Ω terminated input. The reflected power is dissipated through the resistances R1, R3 to ground instead of being passed to the PA input network. This further improves stability. By dissipating this reverse power into the resistances R1, R3, less reverse power appears at the driver module 14, which improves driver stability. Dissipating the reverse energy on the input sides of the switch elements Q1, Q2 rather than on the output sides of the switch elements Q1, Q2 minimizes power loss of the PA module 16 or 16' and/or of the driver module 14, which prevents negatively affecting RF deck efficiency. Incorporating shunt resistances on the output side dissipates forward and reverse energy, which results in wasted power (or lost power) and reduced efficiency.

Incorporation of the capacitances C2, C3 and the resistances R1, R3 as described above, allows PA transistors in a push-pull topology (e.g., switch elements Q1, Q2) to be stable into VSWR loads of various phases irrespective of the frequency of operation. Stability is provided when operating at low frequencies of operation where transistor gain increases (as frequency of operation decreases gain of the switch elements increases). The implementations disclosed herein allow multiple push-pull PAs to be stable when used in parallel for increased output power. Stability requirements can be more stringent for systems that operate at increased output power levels. The implementations can be used to satisfy these stability requirements.

Although the front end module 50' is primarily described with respect to a push-pull implementation, features of the front end module 50' may be applied to single ended implementations of a power amplifier. For, example, incorporation of the capacitances C2, C3 and the resistances R1, R3 may be incorporated in single ended implementation to provide PA stability into VSWR loads of various phases irrespective of frequency of operation including low frequencies of operation where gain of the PA transistors is increased.

The front end module 50' may be used in the driver module 14. The internal configurations of the driver module 14 and the PA module 16 may be the same. Incorporation of the front end module 50' into the driver module 14 allows a push-pull driver stage to be stable when the PA module 16 is driving high VSWR transient loads or out of band energy dissipating loads when operating at various phases. Incorporation of the capacitances C2, C3 and the resistances R1, R3 in a front end module of the driver module 14 aids in removing instability in the driver module 14, which increases stability of the power generator system 10 for various phases.

The implementation of FIG. 3 provides wideband and close in sideband stability for various PA input voltages, PA loads, phases of operation, and frequencies of operation. The implementation allows input impedance of a PA to be accurately matched to a predetermined impedance (e.g., 50Ω). Furthermore, stability is provided in the presence of normal variations in PA switch element (transistor) characteristics (e.g., variations in transistor gain, input capacitance, etc.).

What is claimed is:

1. A power amplifier comprising:
   a first input module comprising a transformer and configured to receive a first radio frequency signal and generate output signals;
   impedance transformation modules each of which having an output impedance and configured to receive a respective one of the output signals from the transformer; and
   switch modules each of which comprising a transistor and connected to an output of one of the impedance transformation modules, wherein the transistor has an input impedance and outputs an amplified signal, and
   wherein each of the output impedances is mismatched relative to a respective one of the input impedances.

2. The power amplifier of claim 1, wherein the input power amplifier comprises:
   an inductance having an input and an output, wherein the input of the inductance is configured to receive the first radio frequency signal; and
   a capacitance having a first terminal connected to the output of the inductance and to an input of the transformer.

3. The power amplifier of claim 1, wherein the impedance transformation modules are each configured to dissipate reflected power received from the switch modules.

4. The power amplifier of claim 1, wherein:
   each of the impedance transformation modules comprises a capacitance,
   the capacitance is in series with a respective output of the transformer and is connected to a control input of a respective one of the transistors.

5. The power amplifier of claim 4, wherein the output impedances are output impedances of the capacitances.

6. The power amplifier of claim 4, wherein each of the impedance transformation modules further comprises an inductance in series with a respective one of the capacitances between the transformer and an input of the respective one of the capacitances.

7. The power amplifier of claim 4, wherein the capacitances of the impedance transformation modules increase input impedances and reactances at control terminals of the transistors.

8. The power amplifier of claim 4, wherein the capacitances of the impedance transformation modules reduce gain at frequencies other than a fundamental operating frequency of the power amplifier.

9. The power amplifier of claim 4, wherein each of the impedance transformation modules further comprises a resistance connected between an input of one of the capacitances of the impedance transformation modules and a voltage reference terminal.

10. The power amplifier of claim 9, wherein the resistances reduce impedances at inputs of the capacitances and dissipate reflected power received by the switch modules.

11. The power amplifier of claim 9, wherein:
each of the impedance transformation modules further comprises an inductance; and
the resistances compensate for impedance mismatching of the transistors and the capacitances to impedance match outputs of the inductances.

12. The power amplifier of claim 4, wherein:
each of the impedance transformation modules further comprises a biasing circuit; and
the biasing circuit is connected to an output of one of the capacitances and is configured to generate a bias voltage.

13. The power amplifier of claim 1, further comprising:
a combiner module configured to combine outputs of the transistors to generate a combined output signal; and
an output module configured to filter the combined output signal to generate a power amplifier output signal.

14. The power amplifier of claim 13 comprising:
a second input module configured to receive a second radio frequency signal and generate a conditioned signal;
a driver module configured to receive the conditioned signal and generate the first radio frequency signal; and
a load configured to receive the power amplifier output signal.

15. A power amplifier comprising:
an input module comprising a transformer and configured to receive a first radio frequency signal, wherein the transformer comprises
a first end configured to output a first output signal based on the first radio frequency signal, and
a second end configured to output a second output signal based on the first radio frequency signal;
a first capacitance in series with the first end and having a first output impedance;
a second capacitance in series with the second end and having a second output impedance;
a first transistor comprising a control terminal connected to the first capacitance, having a first input impedance, and outputting a first amplified signal, wherein the first input impedance does not match the first output impedance; and
a second transistor comprising a control terminal connected to the second capacitance, having a second input impedance, and outputting a second amplified signal, wherein the second input impedance does not match the second output impedance.

16. The power amplifier of claim 15, wherein the input power amplifier comprises:
an inductance having an input and an output, wherein the input of the inductance is configured to receive the first radio frequency signal; and
a capacitance having a first terminal connected to the output of the inductance and to an input of the transformer.

17. The power amplifier of claim 15, further comprising:
a first inductance in series between the first end and the first capacitance;
a first resistance having a first terminal and a second terminal, wherein the first terminal of the first resistance is connected to the first inductance and to an input of the first capacitance, and wherein the second terminal of the first resistance receives a reference voltage;
a second inductance in series between the second end and the second capacitance; and
a second resistance having a first terminal and a second terminal, wherein the first terminal of the second resistance is connected to the second inductance and to an input of the second capacitance, and wherein the second terminal of the second resistance receives the reference voltage.

18. The power amplifier of claim 17, wherein:
the first resistance
reduces an impedance at an input of the first capacitance and dissipates a first reflected power signal received by the first transistor, and
compensates for impedance mismatching of an input of the first transistor and an output of the first capacitance to impedance match an output of the first inductance; and
the second resistance
reduces an impedance at an input of the second capacitance and dissipates a second reflected power signal received by the second transistor, and
compensates for impedance mismatching of an input of the second transistor and an output of the second capacitance to impedance match an output of the second inductance.

19. The power amplifier of claim 15, further comprising:
a first biasing circuit configured to generate a first bias voltage, wherein an output of the first capacitance and the control terminal of the first transistor receive the first bias voltage; and
a second biasing circuit configured to generate a second bias voltage, wherein an output of the second capacitance and the control terminal of the second transistor receive the first bias voltage.

20. The power amplifier of claim 15, wherein the capacitances:
increase input impedances and reactances at the control terminals of the first transistor and the second transistor; and
reduce gain at frequencies other than a fundamental operating frequency of the power amplifier.

* * * * *